United States Patent [19]

Stookey et al.

[11] 4,087,280

[45] May 2, 1978

[54] METHOD FOR ENHANCING THE IMAGE CONTRAST IN COLOR TELEVISION PICTURE TUBES

[75] Inventors: Stanley Donald Stookey, Painted Post; Brent Merle Wedding, Corning, both of N.Y.

[73] Assignee: Corning Glass Works, Corning, N.Y.

[21] Appl. No.: 778,362

[22] Filed: Mar. 17, 1977

[51] Int. Cl.² .......... G03C 5/04; G03C 5/00; G03C 7/00; C03C 15/00

[52] U.S. Cl. .......... 96/27 R; 96/34; 96/36.1; 96/38.3; 65/DIG. 2; 65/30 R; 65/33; 106/52; 106/DIG. 6; 29/25.17; 354/1

[58] Field of Search .......... 96/36.1, 27 R, 34, 38.3; 29/25.17; 354/1; 65/DIG. 2, 30 R, 33; 106/52, DIG. 6

[56] References Cited

U.S. PATENT DOCUMENTS

| | | | |
|---|---|---|---|
| 2,825,634 | 3/1958 | Rindone | 65/30 R X |
| 3,173,850 | 3/1965 | Hood | 65/DIG. 2 |
| 3,615,459 | 10/1971 | Kaplan | 96/36.1 |
| 3,642,651 | 2/1972 | Marboe et al. | 65/32 X |
| 3,905,791 | 9/1975 | Plumat et al. | 65/32 X |
| 3,932,183 | 1/1976 | Fisher et al. | 96/34 X |
| 3,955,981 | 7/1976 | Stackniak | 96/36.1 |
| 4,019,905 | 4/1977 | Tomita et al. | 96/36.1 |
| 4,021,239 | 5/1977 | Ogawa | 96/36.1 X |
| 4,032,342 | 6/1977 | Strik | 96/36.1 |

Primary Examiner—Richard V. Fisher
Assistant Examiner—Frank W. Miga
Attorney, Agent, or Firm—Clinton S. Janes, Jr.; Clarence R. Patty, Jr.

[57] ABSTRACT

This invention relates to a method for reducing the amount of ambient light which is reflected by the phosphor located on the inside surface of a color television picture tube face plate. More particularly, the invention contemplates placing a green-absorbing optical filter in front of the red and blue phosphor areas. The filter is produced from gold-containing glass.

In carrying out the preferred embodiment of the invention, an opaque mask having holes of the desired shape and in the proper pattern is placed near a $CeO_2$-activated, photosensitive gold-containing glass, the glass is exposed through the mask to ultra-violet radiation, and thereafter subjected to a prescribed heat treatment to yield the color filters. The phosphors are applied in dot or slot-shaped configurations in the conventional manner with the blue and red phosphors being placed over the filters and the green phosphor in the clear area.

19 Claims, 6 Drawing Figures

METHOD FOR ENHANCING THE IMAGE CONTRAST IN COLOR TELEVISION PICTURE TUBES

BACKGROUND OF THE INVENTION

Color television picture tubes commonly employ a color screen in combination with a compatible grid or other apertured structure such as the electron shadow mask. This screen is customarily disposed on the inner surface of the face panel of the tube and consists of a multitude of dot or slot-like formations of electron-responsive green, blue, and red cathodoluminescent phosphor materials arranged in a particularly-defined pattern. The respective cathodoluminescent groupings (frequently termed color triads) comprising the patterned screen are formed in accordance with the number of electron guns used by the tube and with the respective apertured shadow mask utilized.

The shadow mask is conventionally of a foraminous nature such that the screen disposed on the inner surface of the face plate is composed of oriented triads of green, blue, and red phosphor dots or slots. Because the phosphor areas are commonly derived via photodeposition through the foraminous mask, those areas will desirably be in registry or alignment along the electron beam paths with the apertures of the shadow mask.

It is well recognized that the contrast exhibited by the image displayed in a color television picture tube is significantly reduced as the level of ambient light is increased. Thus, some television picture tubes yield an image which is hardly visible in bright sunlight. That circumstance is grounded in the fact that the ambient light is reflected by the areas of phosphor (the dots or slots) on the inside surface of the tube face plate. The areas of phosphor are essentially white and have high diffuse reflectivity. This reflection of white light mixes unwanted colors with the light emitted from the phosphor, as well as reducing the light-to-dark ratio (contrast). White light mixed with the output of the blue and red phosphor is especially deleterious since the human eye is much less sensitive to both blue and red, when compared with green. This is illustrated in the eye-sensitivity curve reproduced as FIG. 1. With respect to the eye sensitivity curve, the ordinate of FIG. 1 reflects the relative response of the eye in terms of percent. It will be observed that about 25 times as much radiation having a wave length of 4500A is required to produce the same luminous stimulus as radiation having a wave length of 5500A. (The nominal limits of blue radiation are 4240A–4912A and those of green are 4912A–5750A.)

In black-and-white television picture tubes this effect of reflection from the phosphor areas has been ameliorated somewhat by incorporating a minor amount of a neutral gray tint into the glass composition of the face plate. Because the light must pass through twice the thickness of the glass (in and out) as compared to the emitted image, substantial contrast enhancement can be had.

This practice of including a gray tint in the face plate glass has also been conventional in color television picture tubes. However, the replacement of this nearly-neutral absorption with spectrally-selective filtration at the phosphor spot location will provide a considerably improved color image.

FIG. 2 illustrates the relative spectral emittances of the phosphors conventionally utilized to produce the color triads in color television picture tubes. The ordinate of FIG. 2 reflects the relative energy of the phosphor in terms of percent. By positioning an appropriate green-absorbing filter in front of the red and blue phosphor areas, the luminance of the ambient light which is reflected from the phosphor surface can be significantly reduced, while concurrently only weakly reducing the luminance of the phosphor signal. Inasmuch as the green phosphor emittance and the eye-sensitivity curves are quite similar, a green-transmitting (red and blue absorbing) filter will not appreciably reduce the perceived reflected light luminance.

Ser. No. 778,383, filed concurrently herewith by T. P. Seward, III and B. M. Wedding, discloses the production of color triads in the face plates of color television picture tubes wherein the face plates are prepared from polychromatic glasses. Such glasses can yield a full spectrum of colors based upon glass composition and particular sequences of exposures to high energy or actinic radiation followed by specifically-defined heat treatments. Those glasses do, indeed, provide areas of highly-saturated red, green, and blue coloration which may be employed as filters to enhance image contrast, and can provide transmitted color where a "white" phosphor is employed instead of the conventional three-color phosphor triad.

However, the process described therein is relatively complex and, where improved image contrast in color television picture tubes is the primary goal, a relatively simple method for producing green-absorbing filters which would not substantially reduce the transmittance of light emitted by the blue and red phosphors would be highly desirable.

OBJECTIVES OF THE INVENTION

The principal objective of the instant invention is to provide a method for enhancing the image contrast in color television picture tubes by selectively positioning green-absorbing filters over the red and blue phosphor areas.

Another objective of the invention is to provide green-absorbing filters which do not substantially reduce the transmittance of light emitted by the red and blue phosphors.

Yet another object, and the preferred embodiment, of the invention, is to provide a single material which will produce green-absorbing filtering but will not significantly decrease the transmittance of light emitted by the red and blue phosphors.

SUMMARY OF THE INVENTION

We have found that those objectives can be accomplished by producing the desired green-absorbing filters in gold-containing glass having a composition within narrowly-defined ranges and being treated in accordance with strictly-delimited parameters. The inventive glass can constitute the face plate of the color television picture tube or, more preferably, will consist of a relatively thin lamina which will be applied onto the inside surface of the face plate to form a composite structure. For purposes of this invention, however, the use of an inside lamina will be considered equivalent to developing the filters on the face plate itself since the basic method will be the same therefor.

Five illustrative embodiments of the general overall method are set out below:

In the first and most preferred embodiment, the process comprises five basic steps:

(1) a face plate or a lamina which is applied to a face plate is formed from a photosensitive gold-containing glass;

(2) a grid or mask opaque to actinic radiation, such as X-radiation or ultra-violet radiation, having apertures therein at the proper locations and of the desired geometry to register with the red and blue phosphor members of the color triads, which will be subsequently applied thereto, is placed on or near the face plate or lamina;

(3) the glass is exposed through the mask to actinic radiation;

(4) the glass is heat treated to develop the filter color in the previously-exposed areas; and then (5) the blue, green, and red phosphors are applied in appropriate configurations in the conventional manner with the red and blue phosphors being placed over the color filters and the green phosphor over the uncolored areas.

In the second embodiment of the inventive method, the process also contemplates five general steps:

(1) a face plate or a lamina which is applied to a face plate is formed from a photosensitive gold-containing glass;

(2) the glass is exposed overall to actinic radiation such as X-radiation or ultra-violet radiation;

(3) the glass is heat treated to develop the filter color in the exposed area;

(4) the glass is mechanically abraded or chemically etched to remove areas of said colored glass of the proper configuration and in the appropriate locations to register with the areas of subsequent application of the green phosphor; and then (5) the blue, green, and red phosphors are applied in proper configurations in the conventional manner with the red and blue phosphors being placed over the colored glass and the green phosphor over the filter color-free areas.

Inasmuch as this embodiment of the invention provides phosphor areas which are surrounded by the filter color glass, the image contrast may be greater than that resulting via the first inventive embodiment. However, the mechanical abrasion or chemical leaching step to remove patterned areas of glass requires extreme care.

The third embodiment of the invention comprehends four general steps:

(1) a face plate of a lamina which is applied to a face plate is formed from a non-photosensitive gold-containing glass wherein the glass is in a highly reduced condition;

(2) the glass is heat treated to develop the filter color;

(3) the glass is mechanically abraded or chemically etched to remove areas of said colored glass of the proper configuration and in the proper locations to register with the areas of subsequent application of the green phosphor; and then (4) the blue, green, and red phosphors are applied in proper configurations in the conventional manner with the red and blue phosphors being placed over the colored glass and the green phosphor over the filter color-free areas.

This embodiment of the invention also produces phosphor areas which are surrounded by the filter color glass and, hence, the resulting image may have enhanced contrast when compared with that formed in the first embodiment of the invention. Furthermore, this embodiment eliminates the need for an exposure to actinic radiation prior to heat treatment. Nevertheless, the care and complexity inherent in the mechanical or chemical removal or patterned glass areas render this embodiment less desirable from a commercial standpoint.

The fourth embodiment of the invention involves eight fundamental steps:

(1) a face plate or a lamina which is applied to a face plate is formed from a photosensitive gold-containing glass;

(2) a coating of an actinic radiation opaque photosensitive resist, customarily referred to as a photoresist, is applied over the glass;

(3) the photoresist is exposed to actinic radiation, commonly ultra-violet radiation, at the proper locations and of the desired areal geometry to register with the subsequently to be applied green phosphor members of the color triads, this exposure being carried out for a sufficient length of time to polymerize the photoresist material;

(4) the unexposed (unpolymerized) portion of the photoresist is removed;

(5) the glass is exposed overall to actinic radiation;

(6) the polymerized photoresist material is removed from the glass;

(7) the glass is heat treated to develop the filter color in the exposed areas; and then (8) the blue, green, and red phosphors are applied in proper configurations in the conventional manner with the red and blue phosphors being placed over the colored glass and the green phosphor over the filter color-free areas.

This embodiment of the invention is deemed to be more practically desirable than the second and third embodiments inasmuch as the need for the mechanical or chemical removal of patterned glass areas is eliminated. The embodiment also provides phosphor areas which are surrounded by filter color glass.

The fifth embodiment of the invention comprises nine basic steps:

(1) a face plate or a lamina which is applied to a face plate is formed from a photosensitive gold-containing glass;

(2) the glass is exposed overall to actinic radiation such as X-radiation or ultra-violet radiation;

(3) the glass is heat treated to develop the filter color in the exposed area;

(4) a coating of an actinic radiation opaque photosensitive resist, conventionally referred to as a photoresist, is applied over the glass;

(5) the photoresist is exposed to actinic radiation, customarily ultra-violet radiation, at the proper locations and of the desired areal geometry to register with the subsequently to be applied red and blue phosphor members of the color triads, this exposure being carried out for a sufficient length of time to polymerize the photoresist material;

(6) the unexposed portion of the photoresist is removed;

(7) the glass areas so laid bare are mechanically abraded or chemically etched with a substance essentially unreactive with said polymerized photoresist material to remove the colored glass;

(8) the polymerized photoresist material is removed from the glass; and then (9) the blue, green, and red phosphors are applied in proper configurations in the conventional manner with the red and blue phosphors being placed over the colored glass and the green phosphor over the filter color-free areas.

The use of a photoresist in this embodiment of the inventive method to outline the areas of colored glass to be removed enables better control and, hence, sharper definition of the areas of colored glass to be removed, especially where chemical leaching is undertaken.

U.S. Pat. No. 2,515,937 discloses the manufacture of $CeO_2$-activated, Au-containing photosensitive glasses. The glasses are defined therein as being basically alkali metal silicates with alkaline earth metal oxides being preferred additions. The gold contents are observed to range between about 0.01–0.03% and $CeO_2$ is employed in amounts up to 0.05%. Other conventional glass-forming oxides such as $Al_2O_3$, $B_2O_3$, and $P_2O_5$ may be included, but the composition must be free from compounds of arsenic, antimony, cadmium, uranium, thallium, copper, iron, vanadium, manganese, and selenium since such are stated to inhibit photosensitivity.

The method described therein involved exposing the glass to ultra-violet radiation, X-rays, radioactive radiations, etc. Thereafter, the glass is heated to a temperature below the softening point thereof, preferably between about 500°–600° C., to bring out coloration in the previously-exposed area. The coloration ranges from blue through purple and maroon to a deep red.

We have found that photosensitive glasses within a very narrowly-defined range of compositions, wherein the redox state of the Au ions, as well as the fining of the glass, is controlled by $Sb_2O_3$, can be treated in accordance with the first, second, fourth, and fifth embodiments of the invention to yield a color filter which is highly absorbing in the green portion of the visible spectrum but only weakly absorbing in the red and blue. Such glasses consist essentially, in weight percent as expressed on the oxide basis, of about 70–73% $SiO_2$, 12–15% $Na_2O$, 1–4% $K_2O$, 5–9% BaO, 0.01–2% $Sb_2O_3$, 0.006–0.3% $CeO_2$, and 0.006–0.02% Au. Up to about 6% $Al_2O_3$ is useful to improve the chemical durability of the glass and up to about 2% F can be advantageously added as a melting aid.

The glasses are exposed to ultra-violet radiation or X-radiation for times ranging from one minute to several minutes and then heated between about 575°–650° C. for intervals varying from about one hour to several hours. Increasing the content of $Sb_2O_3$ in the glass composition and/or increasing the flux of ultra-violet radiation, i.e., the intensity and/or time of the exposure, causes the color developed to range from the blue through magenta to red.

The non-photosensitive glasses operable in the third embodiment of the inventive method have a base composition similar to that of the above-described photosensitive glasses, i.e., they consist essentially, by weight as expressed on the oxide basis, of about 70–73% $SiO_2$, 12–15% $Na_2O$, 1–4% $K_2O$, 5–9% BaO, 0.01–2% $Sb_2O_3$, and 0.0006–0.02% Au. However, the presense of $CeO_2$ as a sensitizer is not required and conventional reducing agents such as sugar, starch, carbon, and/or $SnO_2$ will be incorporated.

Heat treatments at temperatures between about 575°–650° C. for periods of time ranging from about one hour to several hours are also effective in developing the desired filter colors. As the state of the glass is rendered more reduced, the color produced will vary from blue through magenta to red.

The most preferred filter color for the present application has a magenta appearance.

DESCRIPTION OF PREFERRED EMBODIMENTS

Figure 1:
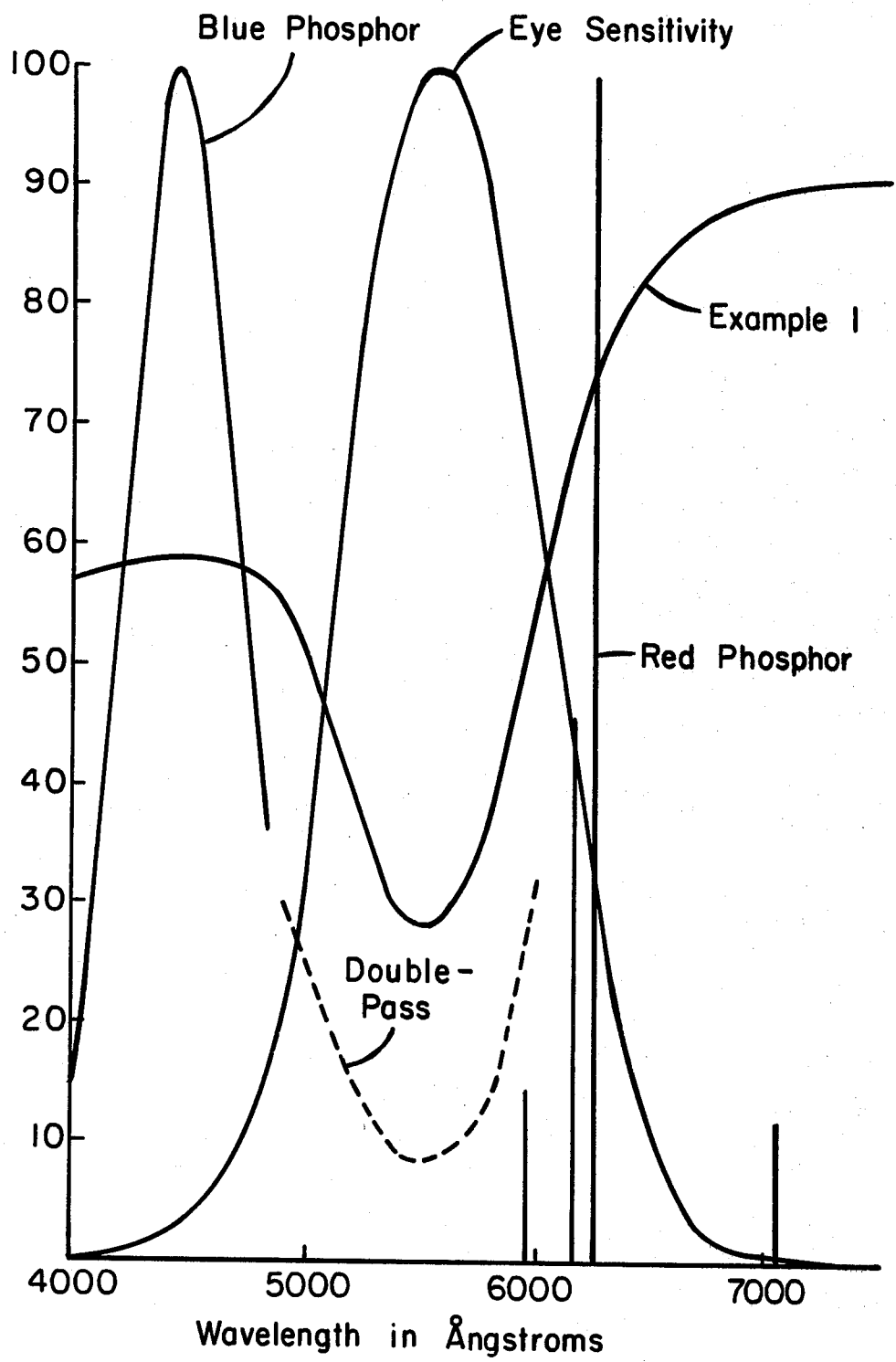
Figure 2:
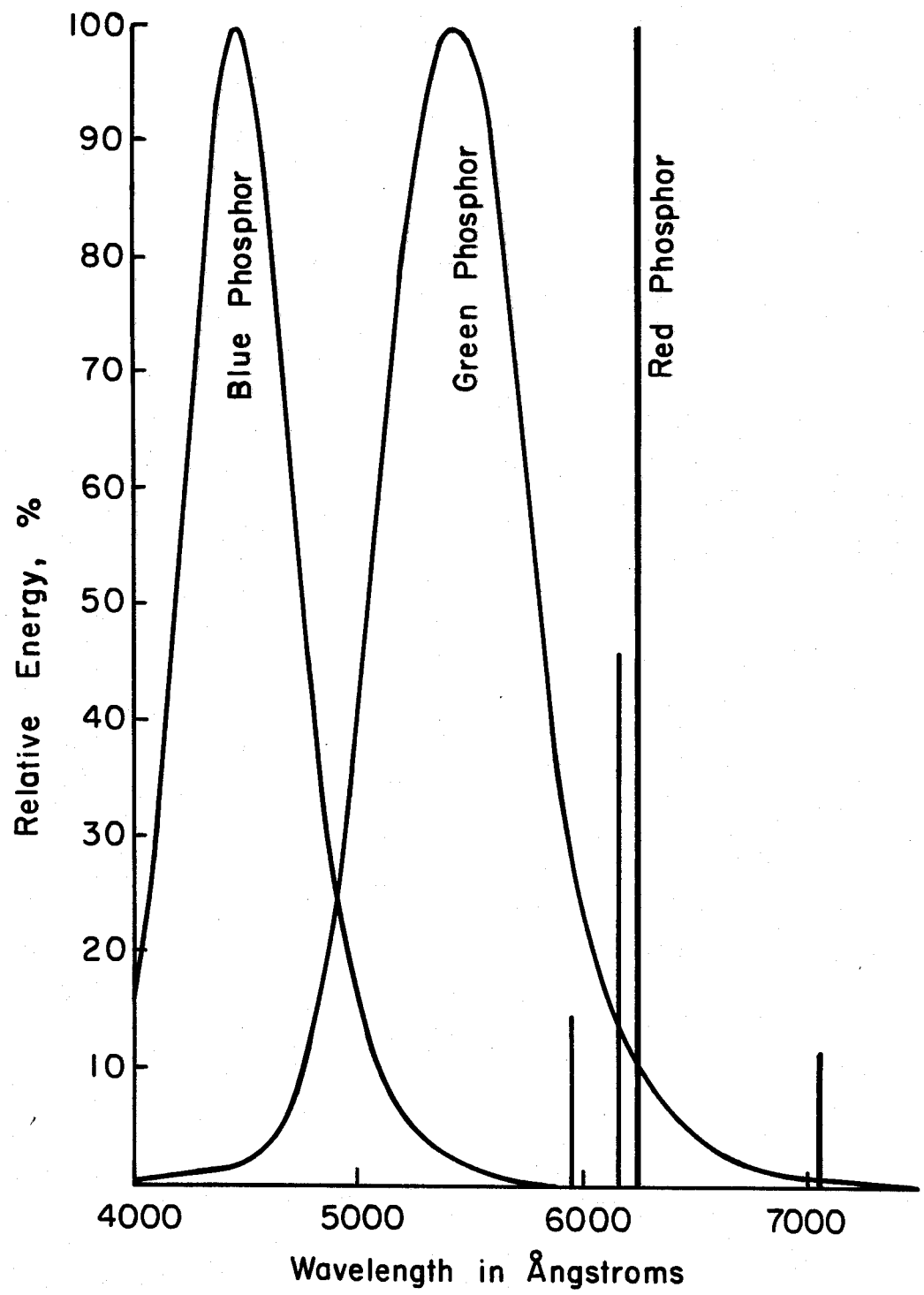

Table I records a number of glass-forming batches for $CeO_2$-activated, photosensitive glasses, in parts by weight on the oxide basis as calculated from the batch, illustrating the compositional parameters of the invention. The batch ingredients can comprise any materials, either the oxide or other compound, which, when melted together with the other constituents, will be converted to the desired oxide in the proper proportions. However, because oxidizing conditions are required during melting, one or more of the batch components will customarily be added in the form of a nitrate or other oxidizing agent.

Since it is not known with which cation(s) the fluoride is combined, it is simply tabulated as fluoride, in accordance with conventional glass analysis practice. Also, inasmuch as the content of gold is very small, it is merely reported as Au. Furthermore, because the sum of the individual components closely approximates 100, for practical purposes each may be considered to be present in weight percent.

Whereas the following description is drawn to laboratory scale melting experiments, it will be appreciated that the production of face plates for television picture tubes would demand large-scale commercial melts. The reported compositions would be operable in commercial melting equipment.

Up to as much as 50% by weight of the fluoride and up to 30% by weight of the gold may be volatilized away during the melting operation. However, the addition of extra quantities of those components to the batch to compensate for those losses is well within the technology of the glass chemist.

The bathces recited in Table I were compounded, the ingredients ballmilled together to aid in securing a homogeneous melt, and then deposited into platinum crucibles. The crucibles were placed in a furnace operating at about 1450°–1500° C. and the batches melted for about seven hours. Thereafter, the melts were pressed in steel molds to yield plates about 0.125 inches thick and the plates were immediately transferred to an annealer.

TABLE I

|  | 1 | 2 | 3 | 4 | 5 | 6 | 7 | 8 | 9 | 10 |
|---|---|---|---|---|---|---|---|---|---|---|
| $SiO_2$ | 71.15 | 71.15 | 71.15 | 71.15 | 71.15 | 71.15 | 71.15 | 71.15 | 71.15 | 71.15 |
| $Na_2O$ | 13.6 | 13.6 | 13.6 | 13.6 | 13.6 | 13.6 | 13.6 | 13.6 | 13.6 | 13.6 |
| $K_2O$ | 2.9 | 2.9 | 2.9 | 2.9 | 2.9 | 2.9 | 2.9 | 2.9 | 2.9 | 2.9 |
| BaO | 7.0 | 7.0 | 7.0 | 7.0 | 7.0 | 7.0 | 7.0 | 7.0 | 7.0 | 7.0 |
| $Al_2O_3$ | 4.35 | 4.35 | 4.35 | 4.35 | 4.35 | 4.35 | 4.35 | 4.35 | 4.35 | 4.35 |
| F | 1.0 | 1.0 | 1.0 | 1.0 | 1.0 | 1.0 | 1.0 | 1.0 | 1.0 | 1.0 |
| $Sb_2O_3$ | 0.8 | — | 0.02 | 0.04 | 0.014 | 0.04 | 0.04 | 0.04 | 0.04 | 0.04 |
| $CeO_2$ | 0.025 | 0.025 | 0.025 | 0.025 | 0.015 | 0.025 | 0.010 | 0.025 | 0.006 | 0.010 |
| Au | 0.0134 | 0.014 | 0.014 | 0.014 | 0.014 | 0.010 | 0.014 | 0.012 | 0.010 | 0.008 |

Table II recites a number of physical properties, viz., softening point (S.P.), annealing point (A.P.), strain point (St.P.), coefficient of thermal expansion (Exp.) over the range 25°-300° C. ($\times 10^{-7}$/° C.), and density (Den.) in terms of g/cm$^3$, specifically determined on Example 1 of Table I employing conventional measuring techniques. The physical properties of the other glasses reported in Table I would closely approximate those values.

TABLE II

| | |
|---|---|
| S.P. | 652° C. |
| A.P. | 457° C. |
| St.P. | 417° C. |
| Exp. | 91.7 |
| Den. | 2.512 |

Table III sets forth transmission measurements (% T) at 4600A, 5500A, and 6150A determined on the glasses of Table I. A 1000 watt mercury vapor lamp having a substantial intensity at a wave length of about 3000A furnished a source of ultra-violet radiation. Samples of the glasses were ground and polished to a predetermined thickness and placed at a distance of about 18 inches from the lamp. After being exposed to ultra-violet radiation for the time recited in Table III, the samples were placed in an electrically-fired furnace, heated therein to 650° C. at furnace rate, and held at that temperature for two hours.

TABLE III

| Example No. | Thickness | %T$_{4600A}$ | %T$_{5500A}$ | %T$_{6150A}$ | Exposure Time |
|---|---|---|---|---|---|
| 3 | 2 mm | 45 | 26 | 34 | 2' |
| 3 | 2 mm | 40 | 25 | 40 | 2.5' |
| 4 | 2 mm | 49 | 25 | 48 | 1.5' |
| 5 | 1 mm | 53 | 21 | 47 | 1' |
| 5 | 1.2 mm | 57.5 | 27 | 50 | 1' |
| 6 | 1.27 mm | 61 | 35 | 51 | 1' |
| 7 | 1.29 mm | 59 | 31 | 45 | 1' |
| 8 | 1.34 mm | 48 | 22 | 50 | 1' |

FIG. 1 delineates the spectral transmittance curve described by Example 1, having a thickness of 1 mm after being exposed to the above mercury vapor lamp for one hour and then subjected to a temperature of 640° C. for two hours. The ordinate of FIG. 1 with respect to the curve described by Example 1 reflects transmittance in terms of percent. The percent transmission at 4600A is about 58.5, at 5500A is about 28, and at 6150A is about 68.

As can be seen from Table III and FIG. 1 the filters can absorb in the green portion of the spectrum in excess of twice that in the red and blue portions thereof. FIG. 1 illustrates the effect on spectral transmittance which Example 1 treated as above has upon the blue and red phosphor. The dotted curve shows the attenuation of the reflected component since the ambient light goes through the filter twice (in and out).

FIGS. 3-6 illustrate a process, representing the most preferred embodiment of the inventive method, which can be conducted in the laboratory for producing the color filters in a glass sheet, which sheet could be laminated either before or after such process to the face plate of a commercial television picture tube. It will be appreciated, of course, that the described process is illustrative only and not limitative of the invention.

Figure 3:
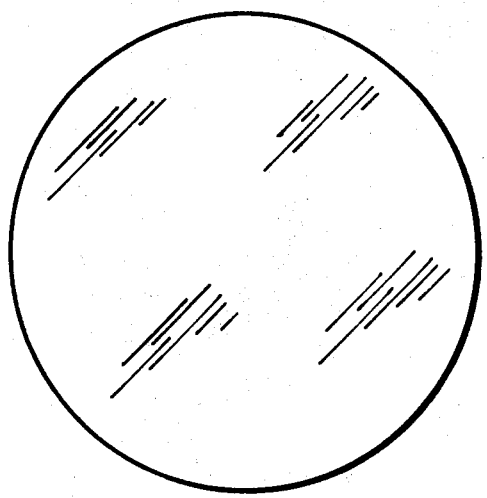
Figure 5:
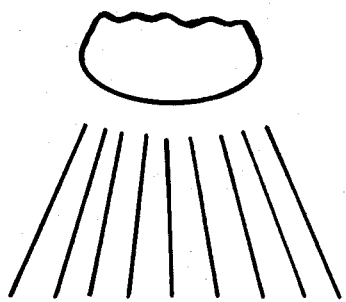
Figure 5:
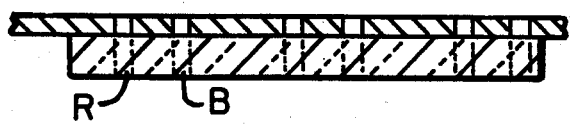
Figure 4:
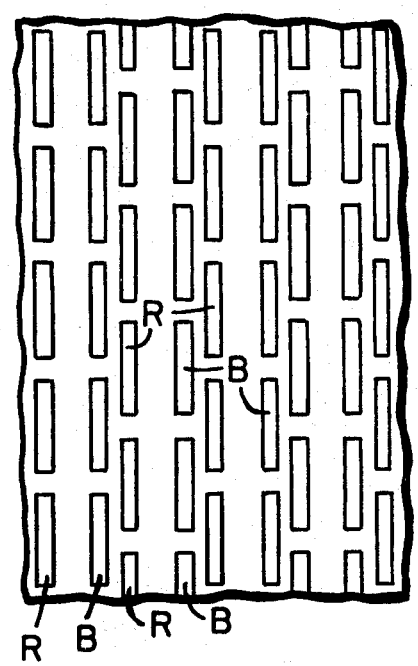
Figure 6:
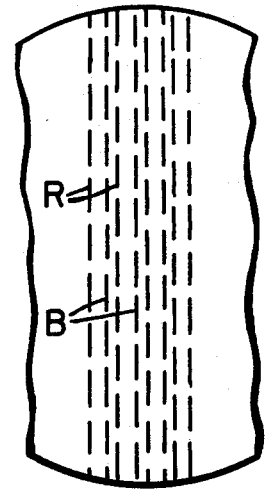

FIG. 3 depicts a disc 1 and FIG. 4 represents a metal grid or screen 2 with slot-shaped apertures 3 in pairs, each pair being in staggered relation to one another. The dimensions of the slots closely approximate, or may be slightly larger, than the area of phosphor which will subsequently be deposited over the color filter. The members of the pairs are spaced apart from each other at a distance approximately, or slightly greater than, the width of the slot-shaped aperture. (The letters R and B refer to the colors red and blue, respectively.) FIG. 5 illustrates metal grid 2 being placed in contact with disc 1 and the resulting composite unit being irradiated by a source of ultra-violet radiation 4, the beam therefrom passing through slots 3 onto disc 1. FIG. 6 demonstrates, in part, the pattern of color filter pairs that is produced when metal grid 2 is removed after the exposure step and disc 1 is subjected to the proper heat treatment. In general, the depth of the color within the glass body will be at least 0.004 inches.

The red, green, and blue phosphors will thereafter be applied in the conventional manner, the red and blue phosphors labelled R and B, respectively, in the FIGURES being placed over the filters and the green phosphor over the clear areas therebetween.

Inasmuch as exposure through a mask having apertures of the same size as that standard for the phosphor dots or slots may result in filter areas too small for most efficient utility, it is preferred that the mask have somewhat enlarged apertures on standard centers. It will be recognized that a mask having actual holes therein is not demanded since a suitably transparent glass with the mask prepared in an opaque layer by photoetching techniques would be equally useful.

Variations in the basic method for locating the color filter areas in the face plate are readily conceivable. As one illustration, the mask and method disclosed by Seward, III and Wedding in Ser. No. 778,383, supra, can be employed to sequentially or simultaneously expose the glass for the red and blue filter areas. Also, the mask can be placed at a uniform distance from the glass and well-collimated ultraviolet radiation directed at the proper angles to achieve the necessary dot or slot locations.

In the second embodiment of the invention, the glasses of Table I can be subjected to an overall exposure of ultraviolet radiation of X-radiation and then heat treated to bring in the desired filter color. Such color, though an integral part of the glass, will desirably not carry through the entire thickness dimension thereof, but will have a depth of at least 0.0004 inches. Thereafter, a masking material such as a commercially-available photoresist is applied, which is patterned to leave exposed the areas of glass subsequently to receive the green phosphor. Where a chemical leachant, rather than mechanical abrasion, is to be employed to remove the glass in the exposed areas, the patterned masking material must be essentially inert to the leachant.

In the third embodiment of the invention, the glasses of Table I (optionally without the CeO$_2$) will be melted with the addition of a conventional reducing agent such as sugar, starch, carbon, SnO$_2$, and the like to the batch. Where the carbon-containing or organic compounds are employed, very little, if any, thereof will remain in the final glass. The use of, and the amount required of, such reducing agents is well-known to the glass technologist. The glass will then be heat treated to bring in the desired filter color, the patterned masking material applied thereto, and the exposed areas mechanically or chemically removed.

It is apparent that, since the filter coloration is integral throughout the thickness dimension of the glass, this embodiment can only be operable in a laminate construction, i.e., color filter is developed in a glass body apart from the face plate of the tube.

The use of photoresists, such as is described in the fourth and fifth embodiments of the invention, is well-known to the art. Most generally, those consist of soluble organic material or a mixture of materials, which polymerizes and becomes insoluble when exposed (normally for no more than a few minutes) to actinic radiation such as ultra-violet radiation. A host of such materials is commercially available. U.S. Pat. No. 2,610,120 describes one such which is polymerizable by ultra-violet radiations. The unexposed (unpolymerized) photoresist is generally removed with a solvent to which the polymerized material is relatively inert. The polymerized material is thereafter removed via solvents, firing to somewhat elevated temperatures, or, in some instances, by wiping off the surface.

We claim:

1. A method for preparing a pattern of integral transparent color filter areas for the face plate of a color television picture tube, said face plate having a tri-color screen composed of patterned color triads of red, green, and blue phosphors, and said color filter areas being highly absorbing in the green portion of the visible spectrum but only weakly absorbing in the blue and red portions thereof, which comprises the steps of:
   (a) forming a photosensitive glass body suitable as a face plate for a color television picture tube or a photosensitive glass body suitable for attachment to said face plate to form a composite body consisting essentially, in weight percent on the oxide basis as calculated from the batch, of about 12-15% $Na_2O$, 1-4% $K_2O$, 5-9% BaO, 0.01-2% $Sb_2O_3$, 0.006-0.3% $CeO_2$, 0.006-0.02% Au, and 70-73% $SiO_2$;
   (b) placing an appropriate mask opaque to ultra-violet radiation or X-radiation having apertures therein at the proper location and of the appropriate geometry on or near said glass body to register with the subsequently to be applied red and blue phosphor members of said color triads;
   (c) exposing said glass body through said mask to ultra-violet radiation or X-radiation;
   (d) heating said glass body to about 575°-650° C. to bring out said color in said exposed area; and then
   (e) cooling said glass body to room temperature.

2. A method according to claim 1 wherein said exposure to ultra-violet or X-radiation is conducted for a period of time ranging between about one minute to several minutes.

3. A method according to claim 1 wherein said glass body is heated for a period of time ranging from about one hour to several hours.

4. A method according to claim 1 wherein said color is integral within said glass body to a depth of at least 0.004 inches.

5. A method for preparing a pattern of integral transparent color filter areas for the face plate of a color television picture tube, said face plate having a tri-color screen composed of patterned color triads of red, green, and blue phosphor, and said color filter areas being highly absorbing in the green portions of the visible spectrum but only weakly absorbing in the blue and red portions thereof, which comprises the steps of:
   (a) forming a photosensitive glass body suitable as a face plate for a color television picture tube or a photosensitive glass body suitable for attachment to said face plate to form a composite body consisting essentially, in weight percent on the oxide basis as calculated from the batch, of about 12-15% $Na_2O$, 1-4% $K_2O$, 5-9% BaO, 0.01-2% $Sb_2O_3$, 0.006-0.3% $CeO_2$, 0.006-0.02% Au, and 70-73% $SiO_2$;
   (b) exposing said glass body to ultra-violet radiation or X-radiation;
   (c) heating said glass body to about 575°-650° C. to bring out said color in said exposed area;
   (d) cooling said glass body to room temperature;
   (e) placing a mask having apertures therein at the proper locations and of the appropriate geometry on said glass body to protect the glass body except areas thereof in registry with the subsequently to be applied green member of the color triads; and then
   (f) removing the unprotected areas of glass through mechanical abrasion or chemical leaching to a depth sufficient to remove said color therefrom.

6. A method according to claim 5 wherein said exposure to ultra-violet radiation or X-radiation is conducted for a period of time ranging between about one minute to several minutes.

7. A method according to claim 5 wherein said glass body is heated for a period of time ranging from about one hour to several hours.

8. A method according to claim 5 wherein said color is integral within said glass body to a depth of at least 0.004 inches.

9. A method for preparing a pattern of integral transparent color filter areas for the face plate of a color television picture tube, said face plate having a tri-color screen composed of patterned color triads of red, green, and blue phosphors, and said color filter areas being highly absorbing in the green portion of the visible spectrum but only wealky absorbing in the blue and red portions thereof, which comprises the steps of:
   (a) melting a batch for a glass consisting essentially, in weight percent on the oxide basis as calculated from the batch, of about 12-15% $Na_2O$, 1-4% $K_2O$, 5-9% BaO, 0.01-2% $Sb_2O_3$, 0.006-0.02% Au, 70-73% $SiO_2$, and a reducing agent in sufficient amounts to cause the resulting glass to be in a highly reduced condition;
   (b) forming a glass body from said melt suitable for attachment to said face plate to form a composite body;
   (c) heating said glass body to about 575°-650° C. to bring out said color throughout said glass body;
   (d) cooling said glass body to room temperature;
   (e) placing a mask having apertures therein at the proper locations and of the appropriate geometry on said glass body to protect the glass body except areas thereof in registry with the subsequently to be applied green member of the color triads; and then
   (f) removing the unprotected areas of glass through mechanical abrasion or chemical leaching to remove said color therefrom.

10. A method according to claim 9 wherein said reducing agent is selected from the group of sugar, starch, carbon, and $SnO_2$.

11. A method according to claim 9 wherein said glass body is heated for a period of time ranging from about one hour to several hours.

12. A method for preparing a pattern of integral transparent color filter areas for the face plate of a color television picture tube, said face plate having a tri-color screen composed of patterened color triads of red, green, and blue phosphors, and said color filter areas being highly absorbing in the green portion of the visible spectrum but only weakly absorbing in the blue and red portions thereof, which comprises the steps of:

(a) forming a photosensitive glass body suitable as a face plate for a color television picture tube or a photosensitive glass body suitable for attachment to said face plate to form a composite body consisting essentially, in weight percent on the oxide basis as calculated from the batch, of about 12–15% $Na_2O$, 1–4% $K_2O$, 5–9% BaO, 0.01–2% $Sb_2O_3$, 0.006–0.3% $CeO_2$, 0.006–0.02% Au, and 70–73% $SiO_2$;

(b) coating a surface of said glass body with an actinic radiation opaque photoresist;

(c) exposing said photoresist to actinic radiation at the proper locations and of the desired areal geometry to register with the subsequently to be applied green members of said color triads, this exposure being conducted for a sufficient length of time to polymerize the photoresist;

(d) removing the unpolymerized portions of the photoresist;

(e) exposing said glass body to actinic radiation;

(f) removing the polymerized portions of the photoresist from the glass body;

(g) heating said glass body to about 575°–650° C. to bring out said color is said exposed area; and then (h) cooling said glass body to room temperature.

13. A method according to claim 12 wherein said exposure of the glass body to actinic radiation is conducted for a period of time ranging between about one minute to several minutes.

14. A method according to claim 12 wherein said glass body is heated for a period of time ranging from about one hour to several hours.

15. A method according to claim 12 wherein said color is integral within said glass body to a depth of at least 0.004 inches.

16. A method for preparing a pattern of integral transparent color filter areas for the face plate of a color television picture tube, said face plate having a tri-color screen composed of patterned color triads of red, green, and blue phosphors, and said color filter areas being highly absorbing in the green portion of the visible spectrum but only weakly absorbing in the blue and red portions thereof, which comprises the steps of:

(a) forming a photosensitive glass body suitable as a face plate for a color television picture tube or a photosensitive glass body suitable for attachment to said face plate to form a composite body consisting essentially, in weight percent on the oxide basis as calculated from the batch, of about 12–15% $Na_2O$, 1–4% $K_2O$, 5–9% BaO, 0.01–2% $Sb_2O_3$, 0.006–0.3% $CeO_2$, 0.006–0.02% Au, and 70–73% $SiO_2$;

(b) exposing said glass body to actinic radiation;

(c) heating said glass body to about 575°–650° C. to bring out said color in said exposed area;

(d) coating a surface of said glass body with an actinic radiation opaque photoresist;

(e) exposing said photoresist to actinic radiation at the proper locations and of the desired areal geometry to register with the subsequently to be applied red and blue phosphor members of the color triads, this exposure being carried out for a sufficient length of time to polymerize the photoresist;

(f) removing the unpolymerized portions of the photoresist to lay bare the glass areas underneath;

(g) removing the bare areas of glass through mechanical abrasion or chemical leaching to remove said color therefrom; and then (h) removing the polymerized portions of the photoresist from the glass body.

17. A method according to claim 16 wherein said exposure of the glass body to actinic radiation is conducted for a period of time ranging between about one minute to several minutes.

18. A method according to claim 16 wherein said glass body is heated for a period of time ranging from about one hour to several hours.

19. A method according to claim 16 wherein said color is integral within said glass body to a depth of at least 0.004 inches.

* * * * *